United States Patent
Xiao et al.

(10) Patent No.: US 9,310,406 B2
(45) Date of Patent: Apr. 12, 2016

(54) REGION-BASED SECURITY EVALUATION METHOD FOR THE ELECTRIC POWER DISTRIBUTION SYSTEM

(75) Inventors: Jun Xiao, Tianjin (CN); Chengshan Wang, Tianjin (CN); Yixin Yu, Tianjin (CN); Wenzhuo Gu, Tianjin (CN)

(73) Assignee: TIANJIN UNIVERSITY, Tianjin (CN)

( * ) Notice: Subject to any disclaimer, the term of this patent is extended or adjusted under 35 U.S.C. 154(b) by 165 days.

(21) Appl. No.: 13/812,518

(22) PCT Filed: Jul. 24, 2012

(86) PCT No.: PCT/CN2012/079090
§ 371 (c)(1),
(2), (4) Date: Apr. 29, 2014

(87) PCT Pub. No.: WO2013/040948
PCT Pub. Date: Mar. 28, 2013

(65) Prior Publication Data
US 2014/0236513 A1 Aug. 21, 2014

(30) Foreign Application Priority Data

Sep. 22, 2011 (CN) .......................... 2011 1 0283824

(51) Int. Cl.
*G01R 25/00* (2006.01)
*G01R 19/00* (2006.01)
*G01R 21/133* (2006.01)
*G01R 21/06* (2006.01)
*H02J 3/12* (2006.01)
(Continued)

(52) U.S. Cl.
CPC .............. *G01R 21/133* (2013.01); *G01R 21/06* (2013.01); *H02J 3/12* (2013.01); *G06Q 50/06* (2013.01); *H02J 2003/007* (2013.01)

(58) Field of Classification Search
CPC .... G01R 21/06; G01R 21/133; G01R 19/251; G01R 22/00; H02J 3/00; H02J 13/00; G01D 4/004; H02H 1/006
USPC ..................................... 702/57, 60–62, 64, 65
See application file for complete search history.

(56) References Cited

U.S. PATENT DOCUMENTS 7,248,977 B2 * 7/2007 Hart ....................... G01D 4/004
340/870.02

FOREIGN PATENT DOCUMENTS

| CN | 101247045 A | 8/2008 |
| CN | 101944741 A | 1/2011 |
| CN | 102025153 A | 4/2011 |

OTHER PUBLICATIONS

Yu. Yixin, Review of Study on Methodology of Security Regions of Power System, <Journal of Tianjin University>, Jun. 2008, p. 635-646, vol. 41 No. 6.

(Continued)

*Primary Examiner* — An Do
(74) *Attorney, Agent, or Firm* — George G. Wang; Bei & Ocean

(57) ABSTRACT

The invention discloses a region-based security evaluation method for the distribution system, which belongs to the eld of electric power distribution system operation. The method contains the following steps: (1) acquiring distribution system security region and security boundaries according to substation transformer capacity of the distribution system and link relationships among the substation transformers (101); (2) acquiring the distance between operating point and the security boundaries (IO2); (3) judging whether the operating point is within the distribution system security region according to the distance between the operating point and security boundaries (103); if yes, performing step (4), otherwise, performing step (5); (4) acquiring the load shortage or excess L,- of a link unit (I04); (5) adjusting the load of the substation transformers until the operating point comes back to the distribution system security region, then performing step (4) (IO5). The method provides more information than traditional N-I simulation in distribution system security assessment; and reduces calculation, increases the operating speed and satisfies the requirement of real-time and on-line operation.

6 Claims, 3 Drawing Sheets

(51) Int. Cl.
*G06Q 50/06* (2012.01)
*H02J 3/00* (2006.01)

(56) References Cited

OTHER PUBLICATIONS

Yu. Yixin, Security Region of Bulk Power System, < Power System Technology >, 2002. Proceedings. PowerCon 2002. International Conference on, p. 13-17.

Xiao, J. etc., Distribution system security region: definition, model and security assessment, < IET Generation, Transmission & Distribution >, Oct. 2012, p. 1029-1035,vol. 6.

Xiao, J. etc. A Supply Capability Model for Distribution Systems, < Automation of Electric Power System > Dec. 2011, p. 47-52, vol. 35 No. 24.

Xiao, J. etc., Total Supply Capability and Its Extended Indices for Distribution Systems: Definition, Model Calculation and Applications, < IET Generation, Transmission & Distribution >, 2011,p. 869-876,vol. 5.

\* cited by examiner

REGION-BASED SECURITY EVALUATION METHOD FOR THE ELECTRIC POWER DISTRIBUTION SYSTEM

CROSS-REFERENCE TO RELATED APPLICATIONS

This application claims priority from CN Application No. 201110283824.0, filed Sep. 11, 2011 and PCT Application No. PCT/CN2012/079090, filed Jul. 24, 2012, the contents of which are incorporated herein in the entirety by reference.

FIELD OF THE INVENTION

The invention relates to the field of electric power distribution system operation, and more particularly, to the region-based security evaluation method for the electric power distribution system.

BACKGROUND OF THE INVENTION

The electric power distribution system is the link between the terminal users and power generation/transmission system, and is also the important part for guaranteeing the reliable power supply for the users. Smart Grid will completely change the electric power distribution system and realize sufficient information technology. It can obtain a great deal of real-time information from power distribution network via new sensors and means of communication. The smart switch apparatus will be widely used, thus providing a brand-new foundation for secure and efficient operation of the electric power distribution system. In recent decades, in electric power transmission system, the research in security region has led to a series of achievements which have been applied in National Electric Power Dispatching and Communication Center, provincial dispatching center, such as Tianjin city and Henan Province in China, and in North America. With ever-increasing the understanding to property and regularity of power system security boundaries, the method of security region provides relative position of the system operating point in the security region, and thus various necessary information can be obtained. The method reduces calculation and simplifies the handling of stability constraints in optimization problems which associated with dispatching. The security theoretical research of electric power distribution system is pretty weak compared to power transmission system. The "Urban Power Network Planning and Design Guidelines" defines N−1 security rule, and develops regulating, constructing and operating the power grid based on the rule.

In fulfilling this invention, the inventor found that the prior art bears the following defects and shortcomings.

The prior art security researches regarding electric power distribution system are presently restricted to N−1 method and power restoration after power breakdown. The N−1 security analytical method of traditional electric power distribution system is to hypothesize fault to each element and analyze security after fault, which has the disadvantages as huge calculation, and slow speed. Moreover, the traditional method is adapted to analysis at off-line, which cannot satisfy the requirements of real-time and on-line operation.

SUMMARY OF THE INVENTION

The technical problem to be solved by the invention is to provide a region-based security evaluation method for the electric power distribution system, which reduces calculation, increases the operating speed and satisfies the requirement of real-time and on-line operation. The brief description is as follows:

A region-based security evaluation method for the electric power distribution system, including the following steps:

a. acquiring electric power distribution system security region and security boundaries according to substation transformer capacity of the electric power distribution system and link relationships between the substation transformers;

b. acquiring the distance between an operating point and the security boundaries;

c. deciding whether the operating point is within the electric power distribution system security region based on the distance between the operating point and security boundaries; if yes, performing step (4), otherwise, performing step (5);

d. acquiring the load shortage or excess $L_i$ of a link unit, thus ending the whole process;

e. adjusting the load of the substation transformers until the operating point falls within the electric power distribution system security region, and then performing step (4).

The electric power distribution system security region is generally expressed as:

$$\Omega_{DSSR} = \{T | g(T) \le 0\} \quad (1)$$

The electric power distribution system security region of the N substation transformers is expressed as:

$$\Omega_{DSSR} = \begin{cases} R_i T_i = \sum_{j \in \Omega_1^{(i)}} tr_{ij} + \sum_{j \in \Omega_2^{(i)}} tr_{ij} (\forall i) & (2) \\ tr_{ij} + R_j T_j \le k R_j (\forall i, j \in \Omega_1^{(i)}) & (3) \\ tr_{ij} + R_j T_j \le R_j (\forall i, j \in \Omega_2^{(i)}) & (4) \\ tr_{ij} \le RL_{ij} (\forall i, j \in \Omega_1^{(i)} \cup \Omega_2^{(i)}) & (5) \\ T_{min} \le T_i \le T_{max} (i \in H) & (6) \end{cases}$$

Wherein g(T) represents a set of inequality constraint to T, $R_i$ is the rated capacity of the substation transformer i; $R_j$ is the rated capacity of the substation transformer j; $T_i$ is the loading rate of the substation transformer i; $T_j$ is the loading rate of the substation transformer j; $Tr_{i,j}$ is the capacity of the transferred load to the substation transformer j when a N−1 fault happens on the substation transformer i; k is short-time permitted overload ratio for substation transformers; $RL_{i,j}$ is the limit capacity of the link line between the substation transformer i and the substation transformer j; $\Omega_1^{(i)}$ is the in-station linking substation transformers set of the substation transformers link unit in which the substation transformer i is centered; $\Omega_2^{(i)}$ is the off-station linking substation transformers set of the substation transformers link unit in which the substation transformer i is centered; $T_{min}$ is the lower limit of $T_i$; $T_{max}$ is the upper limit of the $T_i$; H is the overloaded area; Formula (2) is expressed as when a N−1 fault happens on the substation transformer i, the capacity transferred from the substation transformer i to other substation transformers equals to the self load; Formula (3) is expressed as when a N−1 fault happens on the substation transformer i, the substation transformer load of the same transformer substations shall not exceed short time allowed capacity; Formula (4) is expressed as when a N−1 fault happens on the substation transformer i, the substation transformers of the different transformer substations shall not overloaded; Formula (5) is expressed as when a N−1 fault happens, the transferred capacity between the substation transformers shall not exceed the allowed capacity of the link lines between the substation transformers; Formula (6) is expressed as the loading rate of each substation transformer in the overloaded area is limited between the lower limit and upper limit of the loading rate.

The security boundary $B_i$ is discussed as follows.

The electric power distribution system security region is simplified as:

$$\Omega_{DSSR} = \begin{cases} B_1 \\ B_2 \\ \vdots \\ B_n \end{cases} = \begin{cases} \sum_{k \in LU_1} R_k T_k \leq \sum_{k \in \Omega_2^{(1)}} R_k + \sum_{k \in \Omega_1^{(1)}} kR_k \\ \sum_{k \in LU_2} R_k T_k \leq \sum_{k \in \Omega_2^{(2)}} R_k + \sum_{k \in \Omega_1^{(2)}} kR_k \\ \vdots \\ \sum_{k \in LU_n} R_k T_k \leq \sum_{k \in \Omega_2^{(n)}} R_k + \sum_{k \in \Omega_1^{(n)}} kR_k \end{cases} \quad (7)$$

Wherein, $LU_i$ is defined as a link unit, which expressed as the set comprising the substation transformer i and all substation transformers with linking relationship with the substation transformer i, each inequality is a security boundary for the said electric power distribution system security region, the security boundary $B_i$ is a hyperplane in the loading rate space, the electric power distribution system security region is surrounded by N security boundary $B_i$.

Acquiring the distance between operating point and the security boundaries according to the step (2) is illustrated below:

The distance between the operating point and the security boundary $B_i$ can be calculated by the following formula:

$$D_i = \frac{\sum_{\substack{k \in LUi \\ k \neq i}} R_k - \sum_{k \in LUi} R_k T_k}{\sqrt{\sum_{k \in LUi} R_k^2}} \circ \quad (8)$$

Acquiring the load shortage or excess $L_i$ of the link unit according to the step (4) is:

$$L_i = \sum_{\substack{k \in LUi \\ k \neq i}} R_k - \sum_{k \in LUi} R_k T_k = \sqrt{\sum_{k \in LUi} R_k^2} \times |D_i| \quad (9)$$

wherein, the unit of $L_i$ is MVA.

The invention is to provide a security evaluation method for the electric power distribution system, which has the following advantages compared to the prior art.

The invention first applies region methodology to the efficient operating power distribution network, and it provides current security boundary and optimal control information of power electric power distribution system for the operators, thus realizing the electric power distribution system on-line and real time security monitoring, defending and controlling more scientifically and effectively. On the background of future Smart Grid, the invention has huge application prospect. Due to more and more dispatching centers of electric power distribution system which have wider distribution, after applied the electric power distribution system security region, the calculation for evaluating the security of distribution network is decreased, the level for handling the dispatching fault is upgraded from the present fast restoration to on-line security evaluation and control, thus greatly improving security operating level of electric power distribution system. Moreover, the preconditions of improving the loading rate close to the security limit are orientating and accurate calculating the security boundaries. Compared to the traditional N−1 verification, the invention is more efficient and practical, which not only evaluates the security of operating point, but also points out the location of operating point in the distribution network security region, thus providing important information for analyzing and controlling the security. Furthermore, as long as the topological structure of electric power distribution system is settled, the electric power distribution system security region will be settled regardless of on-off state of interconnection switch, thus reducing the calculation.

DETAILED DESCRIPTION OF PARTICULAR EMBODIMENTS OF THE INVENTION

Figure 1:
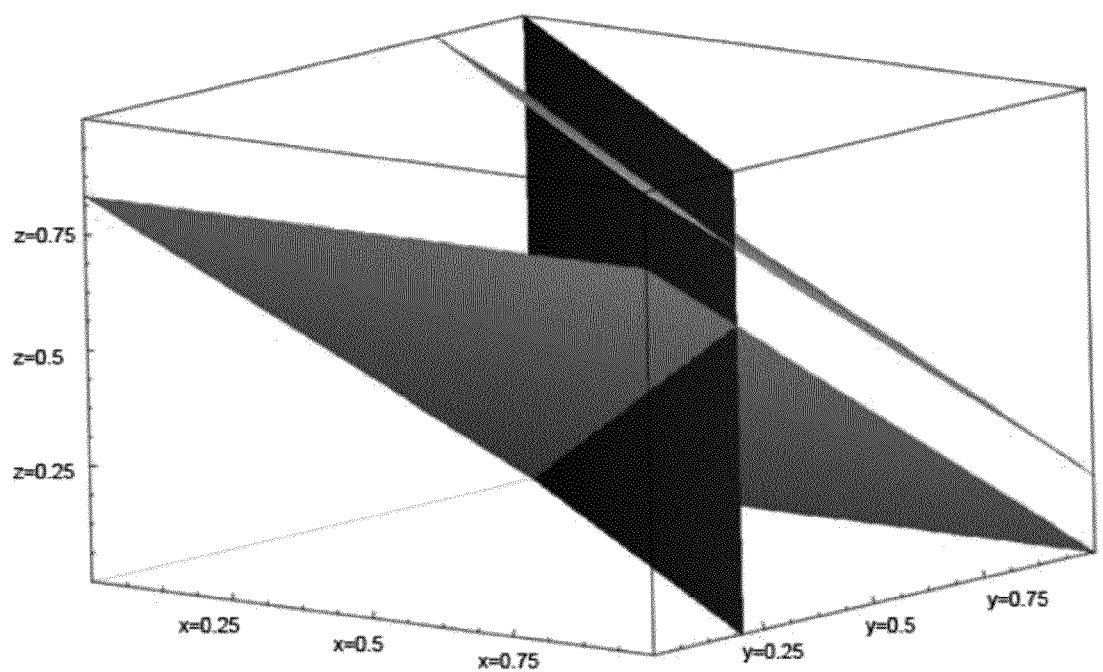
FIG. 1 is a schematic diagram of electric power distribution system security region of the present invention.

In order to make the aims, technical scheme and advantages of the present invention clearer, various embodiments of the present invention will be described in conjunction with the accompanying drawings.

Total Supply Capability (TSC) of electric power distribution system is the important indicator for evaluating security and economic operation of distribution network in recent years. The TSC of electric power distribution system corresponds to Total Transfer Capability (TTC) of electric power transmission system. The inventors found that the substation transformer load of the transformer substation which reached TSC is just the security region boundary of injection power space of electric power distribution system.

The embodiments of the invention firstly applied region methodology to the security steady operating electric power distribution system. It defines Electric power distribution system security region (DSSR) which is in correspondence to the electric power distribution system characteristics, and provides high-speed calculation method for the electric power distribution system security region. Based on the electric power distribution system security region, the invention provides a security evaluation method based on the electric power distribution system security region.

101: acquiring electric power distribution system security region and security boundaries according to substation transformer capacity of the electric power distribution system and link relationships between the substation transformers;

The electric power distribution system N−1 security requires the load be successfully transferred when any element in a failure, and constrains the capacity of each substation transformer of the electric power distribution system. The series of constraints are regarded as a security region in the loading rate space, and each constraint is regarded as a boundary of the security region. The electric power distribution system security region is defined as a set of all operating point T which satisfied distribution network N−1 security constraint in loading rate space, and it describes the security stable operating region in the whole distribution system. Meanwhile, $T=(T_1, T_2 \ldots T_n)$ is a vector of n-dimensional Euclidean space $T^n$ ($T \in R$) wherein $T^n$ is loading rate space, $T_n$ is the loading rate of the $n^{th}$ substation transformer.

Modeling the electric power distribution system security region in the loading rate space is the intersection of operable point which satisfied various security constraints of the electric power distribution system, thus the electric power distribution system security region is generally expressed as:

$$\Omega_{DSSR} = \{T | g(T) \leq 0\} \quad (1)$$

g(T) represents a set of inequality constraint to T, the electric power distribution system security region of the N substation transformers is expressed as:

$$\Omega_{DSSR} = \begin{cases} R_i T_i = \sum_{j \in \Omega_1^{(i)}} tr_{ij} + \sum_{j \in \Omega_2^{(i)}} tr_{ij} (\forall i) & (2) \\ tr_{ij} + R_j T_j \leq k R_j (\forall i, j \in \Omega_1^{(i)}) & (3) \\ tr_{ij} + R_j T_j \leq R_j (\forall i, j \in \Omega_2^{(i)}) & (4) \\ tr_{ij} \leq RL_{ij} (\forall i, j \in \Omega_1^{(i)} \cup \Omega_2^{(i)}) & (5) \\ T_{min} \leq T_i \leq T_{max} (i \in H) & (6) \end{cases}$$

Wherein, $R_i$ is the rated capacity of the substation transformer i; $R_j$ is the rated capacity of the substation transformer j; $T_i$ is the loading rate of the substation transformer i; $T_j$ is the loading rate of the substation transformer j; $Tr_{i,j}$ is the capacity of the transferred load to the substation transformer j when a N–1 fault happens on the substation transformer i; k is short-time permitted overload ratio for substation transformers; $RL_{i,j}$ is the limit capacity of the link line between the substation transformer i and the substation transformer j; $\Omega_1^{(i)}$ is the in-station linking substation transformers set of the substation transformers link unit in which the substation transformer i is centered; $\Omega_2^{(i)}$ is the off-station linking substation transformers set of the substation transformers link unit in which the substation transformer i is centered; $T_{min}$ is the lower limit of $T_i$; $T_{max}$ is the upper limit of the $T_i$; H is the overloaded area.

Wherein, formula (2) is expressed as when a N–1 fault happens on the substation transformer i, the capacity transferred from the substation transformer i to other substation transformers equals to the self load; formula (3) is expressed as when a N–1 fault happens on the substation transformer i, the substation transformer load of the same transformer substations shall not exceed short time allowed capacity; formula (4) is expressed as when a N–1 fault happens on the substation transformer i, the substation transformers of the different transformer substations shall not overloaded; formula (5) is expressed as when a N–1 fault happens, the transferred capacity between the substation transformers shall not exceed the allowed capacity of the link lines between the substation transformers; formula (6) is expressed as the loading rate of each substation transformer in the overloaded area is limited between the lower limit and upper limit of the loading rate.

In order to reflect the major factor and simplify calculation of the electric power distribution system security region, the invention simplifies the electric power distribution system security region. Assuming the contact capacity of the whole substation transformers can realize load transferring and the inner loads of distribution network can be distributed relatively uniformly, the electric power distribution system security region is simplified as:

$$\Omega_{DSSR} = \begin{cases} B_1 \\ B_2 \\ \vdots \\ B_n \end{cases} = \begin{cases} \sum_{k \in LU_1} R_k T_k \leq \sum_{k \in \Omega_2^{(1)}} R_k + \sum_{k \in \Omega_1^{(1)}} k R_k \\ \sum_{k \in LU_2} R_k T_k \leq \sum_{k \in \Omega_2^{(2)}} R_k + \sum_{k \in \Omega_1^{(2)}} k R_k \\ \vdots \\ \sum_{k \in LU_n} R_k T_k \leq \sum_{k \in \Omega_2^{(n)}} R_k + \sum_{k \in \Omega_1^{(n)}} k R_k \end{cases} \quad (7)$$

Wherein, $LU_i$ is defined as a link unit, which expressed as the set comprising the substation transformer i and all substation transformers with linking relationship with the substation transformer i.

Wherein, the inequality (7) includes n inequalities, each inequality is a security boundary for the said electric power distribution system security region, the security boundary is a hyperplane in the loading rate space, $B_i$ expresses the N–1 constraint to substation transformer i, and the electric power distribution system security region (DSSR) is surrounded by n security boundary $B_i$.

102: acquiring the distance between an operating point and the security boundaries;

Wherein, whether the electric power distribution system is secure or not can be decided according to the location of the operating point in the DSSR. The location of operating point in the DSSR can be described by the distance from the operating point in the loading rate space to each hyperplane.

In the loading rate space, the distance between the operating point and the security boundary $B_i$ can be calculated by the following formula:

$$D_i = \frac{\sum_{\substack{k \in LUi \\ k \neq i}} R_k - \sum_{k \in LUi} R_k T_k}{\sqrt{\sum_{k \in LUi} R_k^2}} \quad (8)$$

103: judging whether the operating point is located within the electric power distribution system security region according to the distance between the operating point and security boundaries; if yes, performing step (4), otherwise, performing step (5);

According to the definition of DSSR, when the $D_i$ is positive and the operating point is within the DSSR, the electric power distribution system is in the security operation state; otherwise, when the $D_i$ is negative, the electric power distribution system is in the insecure state. That is to say, the electric power distribution system is security when the operating point satisfies DSSR constraints. Accordingly we can analyze the security of the electric power distribution system by the method.

104: acquiring the load shortage or excess $L_i$ of the link unit, thus finishing the entire procedure;

The security distance is in proportion to the losing load of the link unit when N–1 fault happened in substation transformer i, and is in proportion to the excess capacity of the link unit when distance $D_i$ is positive. $L_i$ expresses as the load shortage or excess of the link unit, $L_i$ is expressed as:

$$L_i = \sum_{\substack{k \in LUi \\ k \neq i}} R_k - \sum_{k \in LUi} R_k T_k = \sqrt{\sum_{k \in LUi} R_k^2} \times |D_i| \quad (9)$$

Wherein, the unit of $L_i$ is MVA.

105: adjusting the load of the substation transformers until the operating point back to the electric power distribution system security region, then performing step (4).

Wherein, adjusting the load of substation transformers based on the value of $D_i$ in specific operation, then repeating the steps 101 to 103, and performing step 104 when the operating point comes back to the DSSR, acquiring the load shortage or excess $L_i$ of the contact unit, hence ending the entire process.

Referring to FIG. 1, the DSSR in the three-dimensional space when there are only three substation transformers in the distribution network, the DSSR in the three-dimensional space can be expressed as a visual graph, the each plane of the cube in the graph and three planes in yellow, purple and orange color express as the security boundaries (the security boundaries in the n-dimensional space are hyperplanes), the DSSR is a polyhedron surrounded by yellow plane, orange plane and three planes which crossed original point. If there are more than three substation transformers in the distribution network, the DSSR visual analysis can be done separately by fixing loading rate of some substation transformers.

The following description further describes the embodiments of the present invention combining with an electric power distribution system.

1. Basics of the Electric Power Distribution System

Figure 2:
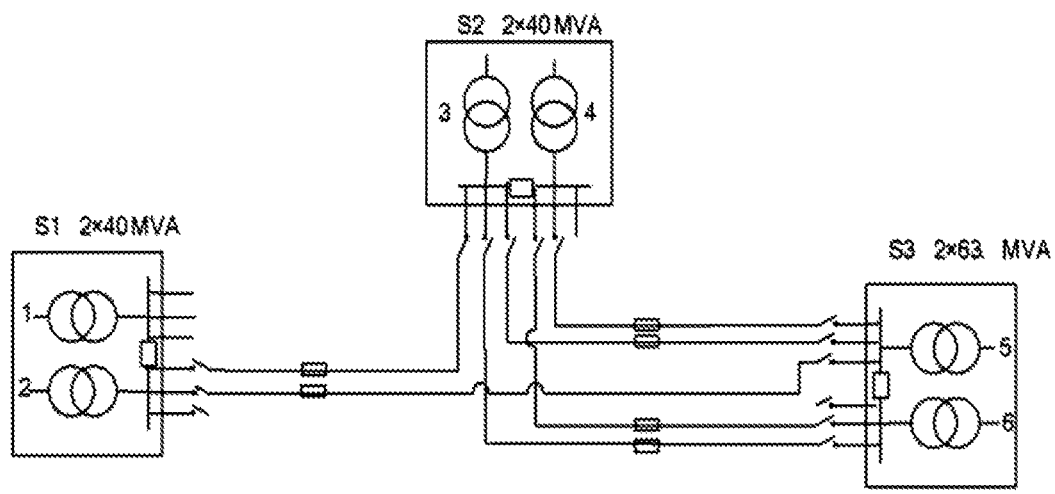
FIG. 2 is a structural diagram of electric power distribution system of the present invention.
Figure 3:
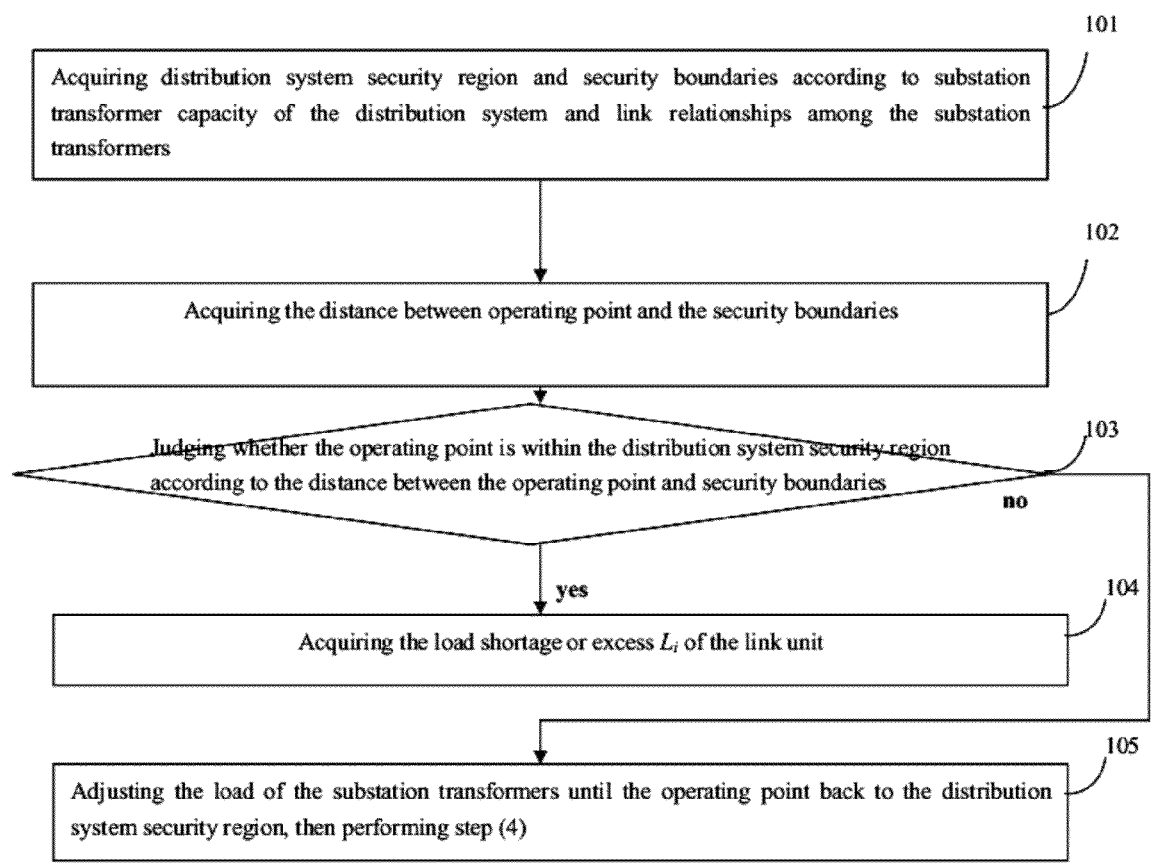
FIG. 3 is a flow diagram of security evaluation method for the electric power distribution system of the present invention.

As shown in FIG. 2, the interconnections among substation transformers are shown in Table 1.

TABLE 1

Transformer Substation Data of Electric power distribution system

| Substation | Substation Transformer | Transformer Ratio (kV/kV) | Capacity (MVA) |
|---|---|---|---|
| S1 | 1 | 35/10 | 40.0 |
|  | 2 | 35/10 | 40.0 |
| S2 | 3 | 35/10 | 40.0 |
|  | 4 | 35/10 | 40.0 |
| S3 | 5 | 110/10 | 63.0 |
|  | 6 | 110/10 | 63.0 |

Over-load factor of substation transformer k=1, according to the link relationship of substation transformers in the electric power distribution system, the DSSR can be obtained by data in Table 1 and Formula (7) as:

$$\Omega_{DSSR} = \begin{cases} 40T_1 + 40T_2 & \leq 40 \\ 40T_1 + 40T_2 + 40T_3 + 63T_5 & \leq 143 \\ 40T_2 + 40T_3 + 40T_4 + 63T_5 + 63T_6 & \leq 206 \\ 40T_3 + 40T_4 + 63T_5 + 63T_6 & \leq 166 \\ 40T_2 + 40T_3 + 40T_4 + 63T_5 + 63T_6 & \leq 183 \\ 40T_3 + 40T_4 + 63T_5 + 63T_6 & \leq 143 \end{cases} \quad (11)$$

It can be seen by the DSSR, the DSSR is surrounded by six hyperplanes which are numbered from $B_1$ to $B_6$.

2. Security Analysis Based on DSSR.

The following analysis on the security of electric power distribution system is made in combination of operating point.

When all the substation transformers in the electric power distribution system are in no-load operation, the operating point is $T_0=(0, 0, 0, 0, 0, 0)$, the location of the operating point in the DSSR can be expressed as the distance from the operating point to each security boundary, thus the security is shown. The distances between $T_0$ and security boundaries are shown as Table 2.

TABLE 2

Distances between $T_0$ and security boundaries

| | $B_i$ | | | | | |
|---|---|---|---|---|---|---|
| | $B_1$ | $B_2$ | $B_3$ | $B_4$ | $B_5$ | $B_6$ |
| $D_i$ | 0.707 | 1.527 | 1.825 | 1.573 | 1.621 | 1.355 |
| $L_i$ (MVA) | 40 | 143 | 206 | 166 | 183 | 143 |

Because of no load, the no-load point is regarded as the most secure operating point in theory; accordingly, the distance is the largest from operating point to the security boundaries. But the efficiency of the no-load point is zero, which is an extreme case.

When all the substation transformers in the electric power distribution system are in half-load operation, the operating point is $T_{half}=(0.5, 0.5, 0.5, 0.5, 0.5, 0.5)$, the locations of $T_{half}$ in the DSSR are shown as Table 3.

TABLE 3

Distances between $T_{half}$ and security boundaries

| | $B_i$ | | | | | |
|---|---|---|---|---|---|---|
| | $B_1$ | $B_2$ | $B_3$ | $B_4$ | $B_5$ | $B_6$ |
| $D_i$ | 0.000 | 0.550 | 0.735 | 0.597 | 0.532 | 0.379 |
| $L_i$ (MVA) | 0 | 52 | 83 | 63 | 60 | 40 |

It can be seen from Table 3 that the distance between operating point $T_{half}$ and all security boundaries are non-negative, which is security. $B_1$ is 0, which shows operating point $T_{half}$ is on the security boundary, to which attention should be paid.

Taking the operating point $T_{ins1}=(0.8, 0.8, 0.8, 0.8, 0.8, 0.8)$ as example, the locations of $T_{ins1}$ in the DSSR are shown as Table 4.

TABLE 4

Distances between $T_{ins1}$ and security boundaries

| | $B_i$ | | | | | |
|---|---|---|---|---|---|---|
| | $B_1$ | $B_2$ | $B_3$ | $B_4$ | $B_5$ | $B_6$ |
| $D_i$ | −0.424 | −0.036 | 0.082 | 0.011 | −0.122 | −0.207 |
| $L_i$ (MVA) | −24 | −3 | 9 | 1 | −14 | −22 |

As seen from Table 4, the operating point $T_{ins1}$ is unsecure, because $T_{ins1}$ is out of four security boundaries. For $B_1$, $L_1$ is −24, which means the contact unit 1 will lose load of 24 MVA when N−1 fault happened in the substation transformer 1.

Take adjusting a substation transformer and two substation transformers as examples to describe the re-evaluation after adopting security steps.

1) Adjusting a Substation Transformer

There are six substation transformers; six situations exist if adjusting one substation transformer. Taking operating point (0.3, 0.8, 0.6, 0.7, 0.7, 0.6) as example, if decreasing the loading rate of the substation transformer 1 to 0.2 or decreasing the load of the substation transformer 2 to 0.7, the electric power distribution system is in secure state. Accordingly, the electric power distribution system will lose load of 40×0.1=4 MVA.

2) Adjusting Two Substation Transformers

Taking operating point T'=(0.3, 0.5, 0.6, 0.9, 0.7, 0.7) as example, the location of the operating point in the DSSR is shown as Table 5.

TABLE 5

Distances between T' and security boundaries

| | $B_i$ | | | | | |
|---|---|---|---|---|---|---|
| | $B_1$ | $B_2$ | $B_3$ | $B_4$ | $B_5$ | $B_6$ |
| $D_i$ | 0.141 | 0.458 | 0.335 | 0.169 | 0.131 | −0.049 |
| $L_i$ (MVA) | 8 | 42.9 | 37.8 | 17.8 | 14.8 | −5.2 |

As is clear from Table 5, the electric power distribution system is in unsecure operating state, the electric power distribution system will lose 5.2MVA load when N−1 fault happened in the substation transformer 6. Thus, this operating point needs adjusting. Taking adjusting load by the substation transformer 1 and the substation transformer 4 as examples, when the loading rates of the substation transformer 1 and 4 are adjusted to $T_1$=0.5, $T_4$=0.7, the electric power distribution system is back to the DSSR after calculation.

In conclusion, the embodiments of the present invention provide a security evaluation method for the electric power distribution system. The invention first applied region methodology to the security efficient operating power distribution network, it provides current security region and optimal control information of power electric power distribution system for the operators, thus realizing the power electric power distribution system on-line and real time security monitoring, defending and controlling more scientifically and effectively. On the background of the future Smart Grid, the invention has huge application prospect. Due to more and more dispatching centers of electric power distribution system which have wider distribution, after applied the electric power distribution system security region, the calculation for evaluating the security of distribution network is decreased, the level for handling the dispatching fault is upgraded from the present fast restoration to on-line security evaluation and control, thus greatly improved security operating level of electric power distribution system. Moreover, the preconditions of improving the loading rate close to the security limit are orientating and accurate calculating the security boundaries. Compared to the traditional N−1 verification, the embodiments of the invention are more efficient and practical, which not only evaluates the security of operating point, but also point out the location of the operating point in the distribution network security region, thus providing important information for analyzing and controlling the security. Furthermore, as long as the topological structure of electric power distribution system is settled, the electric power distribution system security region will be settled regardless of on-off state of interconnection switch, thus reducing the calculation.

REFERENCES

[1] Jun Xiao, Fangxing Li, Wenzhuo Gu, et al, "Total Supply Capability (TSC) and Associated Indices for Distribution Planning: Definition, Model, Calculation and Applications", IET Generation, Transmission & Distribution, Volume 5, Issue 8, pp. 869-876, August 2011.

However, it is understood by those skilled in the art that the figures are the schematic diagram of the preferred embodiments of the present invention; the numbered embodiments are used in the specification for description only and are not presenting the merits or defect of the embodiments.

Although preferred embodiments of the present invention have been shown and described, the present invention is not limited to the aforementioned embodiments. Various modifications, substitutions and improvements may be made by people of ordinary skilled in the art pertaining to the present invention without departing from the spirit and principle of the invention.

What is claimed is:

1. A method for evaluating N−1 region-based security for an electric power distribution system which carries a load and comprises a plurality of substations each of which comprises a substation transformer, comprising steps of:
   (1) calculating an N−1 security region of the distribution system and boundaries of the security region from the capacity of the substation transformers and link relationships between the substation transformers;
   (2) calculating the distance between an operating point and the N−1 security boundaries;
   (3) determining whether the operating point is within the N−1 security region based on the distance between the operating point and security boundaries, and performing step (4) if the operating point is within the security region or performing step (5) if the operating point is not within the security region;
   (4) calculating the amount of load shortage or excess of a link unit to complete an evaluation procedure; and
   (5) if deemed necessary based on the determination in step (3), adjusting the load of the substation transformers until the operating point falls within the N−1 security region, and then performing step (4);
   wherein the N−1 region-based security is a state in which the load is successfully relocated when any one substation in the system fails and the load at other substation is constrained from overloading.

2. The method of claim 1, wherein the security region is generally expressed as:

$$\Omega_{DSSR} = \{T | g(T) \leq 0\} \quad (1)$$

where T is an operating point and g(T) is a set of inequality constraint to T.

3. The method of claim 2, wherein the security region is generally expressed as:

$$\Omega_{DSSR} = \begin{cases} R_i T_i = \sum_{j \in \Omega_1^{(i)}} tr_{ij} + \sum_{j \in \Omega_2^{(i)}} tr_{ij} (\forall\, i) & (2) \\ tr_{ij} + R_j T_j \leq k R_j (\forall\, i,\, j \in \Omega_1^{(i)}) & (3) \\ tr_{ij} + R_j T_j \leq R_j (\forall\, i,\, j \in \Omega_2^{(i)}) & (4) \\ tr_{ij} \leq RL_{ij} (\forall\, i,\, j \in \Omega_1^{(i)} \cup \Omega_2^{(i)}) & (5) \\ T_{min} \leq T_i \leq T_{max} (i \in H) & (6) \end{cases}$$

wherein $R_i$ is a rated capacity of substation transformer i; $R_j$ is a rated capacity of substation transformer j; $T_i$ is a loading rate of substation transformer i; $T_j$ is a loading rate of substation transformer j; $Tr_{ij}$ is a capacity of the transferred load to substation transformer j when a N−1 fault happens on substation transformer i; k is a short-time permitted overload ratio for substation transformers; $RL_{ij}$ is a limit capacity of a link line(i) between substation transformer i and substation transformer j; $\Omega_1^{(1)}$ is a linked transformer set of a link unit within a substation in which substation transformer i is centered; $\Omega_2^{(1)}$ is a linked transformer set of a link unit outside the substation in which substation transformer i is centered; $T_{min}$ is the lower limit of $T_i$; $T_{max}$ is the upper limit of $T_i$; H is an overloaded area; formula (2) is expressed as when a N−1 fault happens on substation transformer i, the load transferred from substation transformer i to other substation transformers equals to the load of itself; formula (3) is expressed as when a N−1 fault happens on substation transformer i, the load of substation transformers in the same substation shall not exceed its short-time permitted overload capacity; formula (4) is expressed as when a N−1 fault happens on substation transformer i, substation transformers of in other substations shall not overload; formula (5) is expressed as when a N−1 fault happens, the load transferred between the substation transformers shall not exceed the allowed capacity of the link lines between the substation transformers; and formula (6) is expressed as the loading rate of each substation transformer in an overloaded area is limited between the lower limit and upper limit of its loading rate.

4. The method of claim 1, wherein the security boundary $B_i$ is as expressed in formula (7) which simplifies the security region as:

$$\Omega_{DSSR} = \begin{cases} B_1 \\ B_2 \\ \vdots \\ B_n \end{cases} = \begin{cases} \sum_{k \in LU_1} R_k T_k \leq \sum_{k \in \Omega_2^{(1)}} R_k + \sum_{k \in \Omega_1^{(1)}} kR_k \\ \sum_{k \in LU_2} R_k T_k \leq \sum_{k \in \Omega_2^{(2)}} R_k + \sum_{k \in \Omega_1^{(2)}} kR_k \\ \cdots \\ \sum_{k \in LU_n} R_k T_k \leq \sum_{k \in \Omega_2^{(n)}} R_k + \sum_{k \in \Omega_1^{(n)}} kR_k \end{cases} \quad (7)$$

wherein $LU_i$ represents a link unit, which is expressed as the set comprising substation transformer i and all substation transformers with a linking relationship with substation transformer i, each inequality is a security boundary for the security region, security boundary $B_i$ is a hyperplane in the loading rate space, and the security region is surrounded by a N number of security boundary $B_i$.

5. The method of claim 4, wherein the distance between the operating point and the security boundaries calculated in step (2) is based on the following formula:

$$D_i = \frac{\sum_{\substack{k \in LU_i \\ k \neq i}} R_k - \sum_{k \in LU_i} R_k T_k}{\sqrt{\sum_{k \in LU_i} R_k^2}} \circ. \quad (8)$$

6. The method of claim 5, wherein the amount of load shortage or excess of a link unit calculated in step (4) is based on the following formula:

$$L_i = \sum_{\substack{k \in LU_i \\ k \neq i}} R_k - \sum_{k \in LU_i} R_k T_k = \sqrt{\sum_{k \in LU_i} R_k^2} \times |D_i| \quad (9)$$

wherein Li's unit is MVA.

\* \* \* \* \*